United States Patent
Heismann et al.

(10) Patent No.: US 7,148,486 B2
(45) Date of Patent: Dec. 12, 2006

(54) IMAGE DETECTOR FOR X-RAY DEVICES WITH REAR-CONTACT ORGANIC IMAGE SENSORS

(75) Inventors: Bjoern Heismann, Erlangen (DE); Juergen Leppert, Forchheim (DE); Thomas von der Haar, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 261 days.

(21) Appl. No.: 10/667,526

(22) Filed: Sep. 23, 2003

(65) Prior Publication Data
US 2004/0113086 A1 Jun. 17, 2004

(30) Foreign Application Priority Data
Sep. 23, 2002 (DE) ............... 102 44 177

(51) Int. Cl.
*G01T 1/24* (2006.01)
(52) U.S. Cl. ............................. 250/370.09
(58) Field of Classification Search ............ 250/370.09
See application file for complete search history.

(56) References Cited

U.S. PATENT DOCUMENTS

| | | | |
|---|---|---|---|
| 5,825,033 A * | 10/1998 | Barrett et al. ............ 250/370.1 |
| 6,169,287 B1 * | 1/2001 | Warburton ............... 250/370.1 |
| 6,403,964 B1 * | 6/2002 | Kyyhkynen ............ 250/370.09 |
| 6,483,099 B1 * | 11/2002 | Yu et al. ................. 250/214.1 |
| 6,510,195 B1 * | 1/2003 | Chappo et al. ............... 378/19 |
| 6,658,082 B1 * | 12/2003 | Okumura et al. ............. 378/19 |
| 6,703,617 B1 * | 3/2004 | Spartiotis et al. ...... 250/370.09 |
| 6,747,290 B1 * | 6/2004 | Yamazaki et al. ............. 257/59 |

FOREIGN PATENT DOCUMENTS

| | | |
|---|---|---|
| DE | 199 06 029 A1 | 8/2000 |
| EP | 0 275 446 A1 | 7/1988 |
| WO | WO 93/03496 | 2/1993 |
| WO | WO 99/39395 | 8/1999 |

* cited by examiner

*Primary Examiner*—Albert Gagliardi
(74) *Attorney, Agent, or Firm*—Harness, Dickey & Pierce

(57) ABSTRACT

An image detector for an x-ray device includes photosensors which have at least two contacts on which an electrical signal occurs when x-rays are detected. In each case, at least one contact of the photosensors is arranged on its rear side, facing away from the image source. Further, the material used for the photosensors is an organic photodiode material.

18 Claims, 1 Drawing Sheet

IMAGE DETECTOR FOR X-RAY DEVICES WITH REAR-CONTACT ORGANIC IMAGE SENSORS

The present application hereby claims priority under 35 U.S.C. §119 on German patent application number DE 10244177.4 filed Sep. 23, 2002, the entire contents of which are hereby incorporated herein by reference.

FIELD OF THE INVENTION

The invention generally relates to an electronic image detector for an x-ray device.

BACKGROUND OF THE INVENTION

In x-ray diagnostics, use is increasingly made of electronic image detectors. While, in particular, individual recordings are still frequently recorded with x-ray sensitive film material, even nowadays, it is desirable to use electronic image detectors, above all in the case of series of x-ray recordings. They permit, firstly, the recording of faster image sequences on account of the lower requisite exposure times and dispensing with the mechanical film transport, and, secondly, the data registered can be supplied immediately for electronic evaluation. For example, in computer tomography, a series of thousands of individual recordings have to be assembled to form an overall image, for example to form an x-ray slice.

In computer tomography, use is made of image detectors which include individual module boards. These are in each case composed of a scintillator and an adjacent row of photosensors, which is structured in individually contacted detection points, that is to say in pixel points. The photosensor layer includes a photodiode material and, for each pixel point, that is to say on each measurement channel, supplies an analog current which is proportional to the measured x-ray intensity. An A/D converter converts this into a digital value which is supplied to the evaluation computer as an individual image point, that is to say as a pixel.

Since each pixel point of the photodiode supplies its own measured value via an associated measurement channel, a dedicated electric line must be provided to make contact with each pixel point. Hitherto, the pixel points were arranged linearly, that is to say in a row. Contact is produced by contact surfaces which are arranged in a parallel row arranged separately from the pixel points and to which electric conductor tracks lead. Each contact surface serves as a bonding pad for the respective electric line. The electric lines are led laterally out of the elongate photodiode.

In computer tomography, use is made of module boards having the largest possible number of measurement channels; 10 000 measurement channels and more are desirable. The bonding techniques used are becoming increasingly difficult to handle with such large channel numbers. In addition, one is limited by the bonding technique to a linear arrangement of the photodiodes or pixel points, since, in a flat arrangement, the bonding pads would assume an excessively large surface, which would be viewed as a dead zone for the detector.

A further disadvantage of the previous module construction resides in the long signal paths which were produced between the linearly arranged pixel points and the evaluation electronics. The long signal paths firstly cause long signal propagation times, which are disadvantageous for the evaluation of series of images which follow one another quickly, and secondly they are susceptible to interference signals. Not least, the cost for the production of such a large number of bonding connections is very high. In view of the difficulties of the previous technology, an increase in the number of channels to more than 10 000 appears not to be practical.

Although flat detector concepts are also known instead of the module structure and achieve a higher level of integration in a more cost-effective manner, these concepts, for example panels of amorphous silicon, cannot readily be implemented in computer tomography. In particular, the persistence of the previously known detectors is responsible for the fact that no adequate time resolution and recording dynamics have been achieved.

SUMMARY OF THE INVENTION

An object of an embodiment of the invention is to specify an image detector for x-ray images which has a flat arrangement of detector pixels with a high area fill factor, that is to say with high utilization of the detector surface by detector pixel points. At the same time, the image detector preferably exhibits a good detection sensitivity and good detection dynamics, and should be capable of being connected electrically without difficulty and produced in an uncomplicated manner.

An embodiment of the invention achieves an object with an image detector.

A basic idea of an embodiment of the invention is to specify an image detector with whose detector pixel points contact can be made on the rear. The detector pixel points have an electric contact on their side facing away from the image source, via which contact they are connected electrically. An organic photodiode material is used as the material for the detector pixel points. Organic photodiodes are, firstly, very uncomplicated and cost-effective and, secondly, they have the recording dynamics which are necessary for applications in computer tomography and, inter alia, exhibit no persistence.

Making contact on the rear permits the production of electric connections by means of high integration technologies which can be applied without difficulty instead of the bonding techniques previously used. This is because contact surfaces and sensors are no longer arranged immediately beside one another. In addition, dead zones in the detector surface, which were caused by the bonding pads previously required, are avoided and therefore the fill factor is increased. This permits, in particular, the use of the image detector in computer tomography. In addition, the length of the analog signal propagation paths are reduced to a minimum by an embodiment of the invention.

In an advantageous refinement of an embodiment of the invention, the rear contacts of the detector pixel points are connected to plated-through holes in a substrate which lead to the rear of the substrate. By using such a substrate, additional functionalities can be implemented. For instance, the electric circuit can be configured more complexly and the level of integration can be increased. In addition, the substrate can impart the requisite mechanical stability and shape to the image detector.

In a particularly advantageous refinement of an embodiment of the invention, the substrate is produced from a material which is effective as a shield against x-rays. The material is either an integral constituent part of the material from which the substrate is produced, or it is applied as an additional layer on the substrate. The shielding against x-rays is used for the protection of all the active or passive electric components and other components behind the photosensitive layer of the image detector.

In an advantageous refinement of an embodiment of the invention, electric components, with which the photosensors are connected via the plated-through holes, are mounted on the rear of the substrate. These components can be both active and passive and can be used only for driving the photosensors or else for a first signal preevaluation of the photosensor signals. As a result, the image detector can be used as a module. By assembling individual such modules, various detectors of any desired size and shape can then be put together.

BRIEF DESCRIPTION OF THE DRAWINGS

Exemplary embodiments of the invention will be explained in more detail below using figures in which, in detail.

DETAILED DESCRIPTION OF THE PREFERRED EMBODIMENTS

Figure 1:
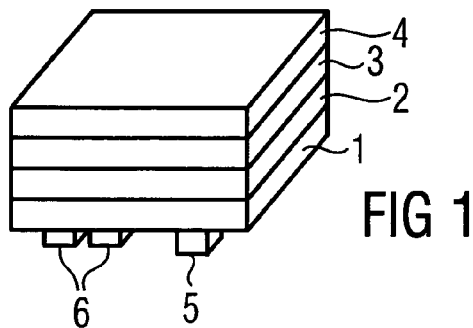
FIG. 1 shows an image detector according to an embodiment of the invention in a perspective view.

An image detector according to an embodiment of the invention is illustrated in FIG. 1 in a perspective view, not to scale. For the construction of the image detector, the substrate 1 is the carrying element. Use is made of a large-area, mechanically stable substrate, for example one of Al2O3 ceramic. Depending on the size of the detector and the intended use, substrates of organic materials or film substrates can also be used.

Illustrated above the substrate 1 is a photosensitive layer 2, which forms the photosensors. The photosensitive layer 2 includes a material which produces an electrical signal as a function of the occurrence of electromagnetic radiation, preferably of an organic photodiode material. However, semiconductor detectors, semiconducting materials or photocells are also suitable. The photosensitive layer 2 can either be formed as a continuous, closed layer of the photosensitive material or assembled from individually structured pixel points of this material. In the case of a continuous layer of the photosensitive material, the individual pixel points are formed by the structure of the electric contact-making means; in this case, when a detection event occurs, an electrical signal can each case be measured on the immediately nearest electric contact.

While a semiconductor image detector could also be used as the photosensitive material if it is capable of producing electrical signals as a direct function of x-rays, in the variant illustrated in FIG. 1, the photosensitive layer provided is an organic diode which can produce electrical signals only as a function of radiation of a wavelength different from x-rays. For this reason, a fluorescent layer 4 is provided, which is arranged above the photosensitive layer 2 and, when excited by x-rays, emits radiation of such a wavelength as can be detected by the photosensitive layer 2. The fluorescent layer 4, also designated a scintillator, can consist, for example, of Gd2O2S with appropriate doping, of CdWO4, of CsI with appropriate doping, of LoS with appropriate doping, of BgO or other known materials. It can be both unstructured and structured in an array or matrix arrangement.

In order to ensure a good optical contact between the photosensitive layer 2 and the fluorescent layer 4, a contact layer 3 is provided, whose surface quality and refractive index are such that the radiation is not excessively reflected or refracted as it passes through the interfaces. In addition, the contact layer 3 can fulfill the function of an adhesion-promoting layer.

If electromagnetic radiation is detected in the photosensitive layer 2, this produces an electrical signal which can be tapped off via two electric contacts. One of the two contacts is located on the front side of the photosensitive layer 2, facing the image source. This contact is produced by the underside of the contact layer 3, which is configured to be electrically conductive and serves as a common contact or as a common potential for all the pixel points. For this purpose, the contact layer 3 includes a conductive material; however, it can also have a conductive coating on its rear side instead. A second contact in each pixel point is located on the other side of the photosensitive layer 2 and is in each case connected to its own contact surface on the substrate 1.

The pixel points are connected through the substrate 1 to the electric components 5, 6 on the rear side of the substrate 1, that is to say located at the bottom in FIG. 1. The components are mounted by use of conventional connecting technologies, for example SMD, ball-grid or flip-chip. They include at least one I/O plug 5, via which signals are interchanged between the image detector and the other x-ray device. These can be the analog or already digitized measured values from the individual pixel points of the photosensitive layer 2. The electric components can additionally also include active electric components 6, in which a preevaluation or evaluation of the signals from the pixel points is carried out, e.g. D/A converters, evaluation asics, DSPs, controller modules or I/O modules.

Since, in particular, active electric components can be damaged by x-rays, the substrate 1 includes a material which serves as a shield against x-rays. This is either an Al2O3 ceramic or an organic material with a filling of a material of high atomic number. As a result, all of the electronics lying behind the substrate 1 are protected against x-rays.

Typical layer thicknesses for the substrate 1 depend on the mechanical and other requirements. Typical layer thicknesses for the fluorescent layer 4, the contact layer 3 and the photosensitive layer 2 lie in the range from 0.3 mm to 10 mm. The layer thicknesses are chosen such that the x-rays can be absorbed as completely as possible and electrical signals with the least possible noise are produced during the detection.

Figure 2:
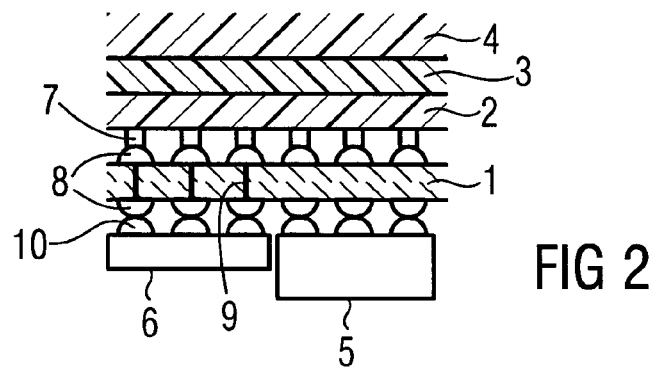
FIG. 2 shows an image detector according to an embodiment of the invention as a section.

FIG. 2 illustrates a section of the image detector from FIG. 1, not to scale. The section shows the same structure as that illustrated in FIG. 1. The x-rays coming from the image source strike the fluorescent layer 4 from above in FIG. 2. In the fluorescent layer 4, they are converted into radiation of a different wavelength which can be detected by the photosensitive layer 2 after it has previously passed through the contact layer 3.

On the rear side of the photosensitive layer 2, facing away from the image source, electric contacts 7 can be seen. These rear contacts 7 are used to make electric contact with the pixel points in the photosensitive layer 2. The latter is applied as a continuous, unstructured layer. The individual pixel points are formed by structuring the rear contacts 7, that is to say a pixel point is defined by each rear contact 7.

The structuring of the rear contacts 7 therefore at the same time corresponds to the pixel arrangement of the photosensitive layer 2.

The rear contacts 7 are connected to the substrate 1 via solder bumps 8, for which reason a solder bonding technique therefore also occurs instead of the conventional bonding technology. The solder bonding technique is better suited to producing connections in high numbers and with a high integration density. The solder bumps are connected to plated-through holes 9, which lead through the substrate 1 to each rear side. On the rear, the plated-through holes 9 are connected to solder bumps 8 on the rear, via which, in turn, the electric components 5, 6 are connected by use of suitable contact elements 10, for example likewise solder bumps. Therefore, the rear of the substrate is also populated by way of a solder bonding technique.

If required, it is possible, in the substrate 1 or on its rear side, to provide metallization planes, in order to be able to configure the electric circuit to be more complex and to integrate it more highly. This possibility can be utilized in particular if the electric components 6 provided are not just simple I/O modules but also D/A converters, evaluation asics, DSPs or controller modules which perform digitization and evaluation of the image detector signals. As a result of populating the rear of the substrate with electrically active evaluation components 6, the result is a particularly advantageous variant of an embodiment of the invention, since in this way such long analog signal propagation paths from the pixel points of the photosensitive layer 2 to the evaluation electronics are avoided. Thus, short signal propagation times and a low susceptibility to interference signals are ensured. Short signal propagation times play a major part in particular for the use of the image detector in computer tomography with its fast individual image sequences.

In order to protect the evaluation electronics 6 against damage by x-rays, shielding has to be provided which, as described in the case of FIG. 1, is integrated into the substrate 1. The integration of the x-ray shielding into the substrate 1 brings with it the additional advantage that separate shielding of the evaluation electronics 6 is not required if these are accommodated separately, for example in a box arranged at the side. This dispenses not only with the necessity for shielding to be provided separately on its own, but also the requirement to find a space for the evaluation electronics 6 which is particularly suitable with regard to scattered radiation.

Figure 3:
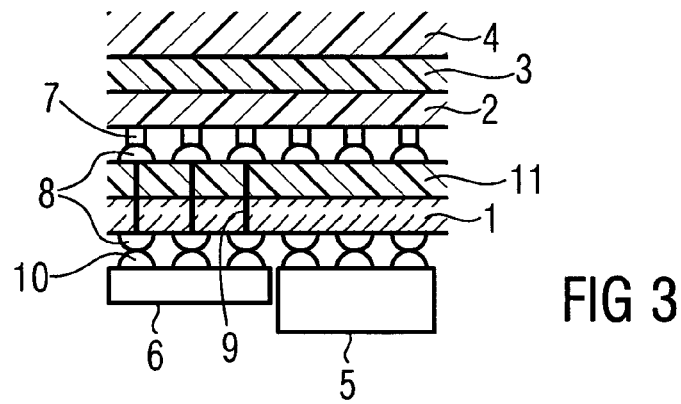
FIG. 3 shows variants of the image detector according to an embodiment of the invention as a section.

FIG. 3 shows a variant of the image detector according to an embodiment of the invention in a section, not to scale. FIG. 3 shows all the detector constituent parts already explained in the preceding FIG. 2 by using the same designations, but in addition the separate x-ray protective layer 11 is illustrated. The latter is arranged between the photosensitive layer 2 and the substrate 1 and applied to the substrate 1. It is produced from an organic material which is simple to process and to print on and is filled with a material of high atomic number in order to achieve a low transparency to x-rays. The structuring of the substrate 1 is carried out following the application of the x-ray protective layer 11, since the plated-through holes 9 must reach through the x-ray protective layer 11, and the solder bumps 8 must be arranged on the x-ray protective layer 11.

Further variants are conceivable, in which the x-ray protective layer 11 is applied to the rear of the substrate 1 or to the rear of the photosensitive layer 2. In the arrangement of the x-ray protective layer 11, it is merely important that those electric components of the image detector which are sensitive to damage by x-rays are located on the other side of the protective layer 11 in the x-ray beam path. Since it is primarily the electric components 6 which are considered to be sensitive components, the protective layer 11 must above all be placed in front of these.

Figure 4:
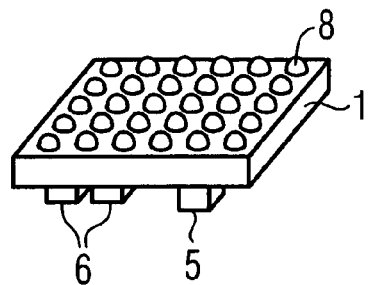
FIG. 4 shows an image detector substrate according to an embodiment of the invention with contact surfaces for photosensors, in a perspective top view.

FIG. 4 illustrates a perspective top view of the substrate of the image detector according to an embodiment of the invention, not to scale. In the figure, the fluorescent layer 4, the contact layer 3 and the photosensitive layer 2 are not illustrated, in order to be able to show the surface of the substrate 1. On the rear, the substrate 1 is populated with the electric components 5, 6 and, on the front, that is to say on the side facing the image source, has a matrix-like array of solder bumps 8. As described previously, this array corresponds to the structuring of the pixel points in the photosensitive layer 2, specifically irrespective of whether the latter is applied as a continuous layer or structured for its part. The array therefore at the same time corresponds to the pixel arrangement of the image detector.

The image detector described and illustrated in the figures has a surface shape and size which can be predefined as desired and can be structured in pixels as desired, and in addition it comprises evaluation electronics 6. Therefore, depending on the desired image size, it can either be used individually or, as a module, can be assembled together with further such image detector modules to form a larger image detector. For the image detector or the image detector module illustrated, edge lengths of a few cm up to a few tens of cm can readily be implemented. By assembling such detector modules, image detectors with a total surface which, in principle, is unlimited can be implemented.

The use of organic materials for as many elements or layers as possible of the image detector is of particular advantage with regard to the expenditure on fabrication. Therefore, the image detector is built up on the basis of a mechanically stable substrate 1, upon which the further constituent parts are printed as films or mounted by a solder bonding technique. In particular, the organic photosensitive layer 2, possibly together with the contact layer 3 and fluorescent layer 4, can be produced as a film. In addition to optimizing the expenditure on fabrication, film technology provides the further advantage of a very flexible structuring capability. In addition, organic photodiodes, in particular, because of their low persistence and their fast image dynamics, are exeptionally well suited for use in computer tomography.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image detector for an x-ray device, comprising:
 a plurality of photosensors, each including at least two electric contacts on which an electrical signal occurs upon an x-ray being detected,
 wherein at least one contact of each of the plurality of photosensors is arranged on a rear side, facing away from an image source,
 wherein a material used for the plurality of photosensors is an organic photodiode material,
 wherein the plurality of photosensors are arranged on a substrate, and
 wherein the at least one rear side contact of the photosensors is directly connected to an electric component via a plated-through hole in the substrate and at least one solder bump.

2. The image detector as claimed in claim 1, wherein the photosensors form an array in a spatially distributed arrangement.

3. The image detector as claimed in claim 1, wherein the substrate includes a material which exhibits a relatively low transparency to x-rays.

4. The image detector as claimed in claim 3, wherein a layer, which has a relative low transparency to x-rays, is arranged on at least one of a front side and a rear side of the substrate.

5. The image detector as claimed in claim 3, wherein electric components and conductor tracks are arranged on the rear side of the substrate, wherein the tracks are connected to the plated-through holes and, via the plated-through holes, to the rear contacts of the photosensors, and wherein the photosensors are driven by the electric components and electrical signals of the electric components are tapped off.

6. The image detector as claimed in claim 1, wherein a layer, which has a relative low transparency to x-rays, is arranged on at least one of a front side and a rear side of the substrate.

7. The image detector as claimed in claim 6, wherein electric components and conductor tracks are arranged on the rear side of the substrate, wherein the tracks are connected to the plated-through holes and, via the plated-through holes, to the rear contacts of the photosensors, and wherein the photosensors are driven by the electric components and electrical signals of the electric components are tapped off.

8. The image detector as claimed in claim 1, wherein electric components and conductor tracks are arranged on the rear side of the substrate, wherein the tracks are connected to the plated-through holes and, via the plated-through holes, to the rear contacts of the photosensors, and wherein the photosensors are driven by the electric components and electrical signals of the electric components are tapped off.

9. The image detector as claimed in claim 8, wherein the electric components on the rear of the substrate also include electrically active components, wherein the signals from the photosensors are at least one of A/D converted and evaluated by the electrically active components.

10. The image detector as claimed in claim 1, wherein a contact of each photosensor is arranged on a front side of the photosensor, facing the image source, wherein an electrically conductive layer is provided which contacts all of the front-side contacts of the photosensors, and wherein the layer serves as at least one of a fluorescent layer and a contact layer to a fluorescent layer.

11. The image detector of claim 1, wherein the substrate includes an organic material with a filling of a material having a high atomic number serving as a shield against x-rays.

12. An image detector for an x-ray device, comprising:
    a plurality of photosensors, each including at least two electric contacts, adapted to detect an x-ray,
    wherein at least one contact of each the photosensors is arranged so as to face away from an image source,
    wherein the photosensors include an organic photodiode material,
    wherein the plurality of photosensors are arranged on a substrate, and
    wherein the at least one contact of each of the photosensors is directly connected to an electric component via a plated-through hole in the substrate and at least one solder bump.

13. The image detector as claimed in claim 12, wherein the photo sensors form an array in a spatially distributed arrangement.

14. The image detector as claimed in claim 12, wherein the substrate includes a material which exhibits a relatively low transparency to x-rays.

15. The image detector of claim 12, wherein each of the photosensors further includes a fluorescent layer, which, when excited by an x-ray, emits radiation detectable by the organic photodiode material.

16. An image detector for an x-ray device, comprising:
    a plurality of photosensors, each including,
        an organic photosensitive layer to receive an x-ray from an image source, at least one electric contact arranged on a rear of the organic photosensitive layer, to receive electrical signals upon the x-ray being received,
    a substrate layer including a material which exhibits a relatively low transparency to x-rays; and
    at least one active component, arranged beneath the substrate layer,
    wherein the at least one active component is directly connected to the at least one electric contact via a plated-through hole and at least one solder bump.

17. The image detector of claim 1, wherein each of the photosensors further includes a fluorescent layer, which, when excited by an x-ray, emits radiation detectable by the organic photodiode material.

18. The image detector of claim 16, wherein each of the photosensors further includes a fluorescent layer which, when excited by an x-ray, emits radiation detectable by the organic photosensitive layer.

* * * * *